United States Patent [19]

Akins et al.

[11] Patent Number: 4,987,578

[45] Date of Patent: Jan. 22, 1991

[54] MASK PROGRAMMABLE BUS CONTROL GATE ARRAY

[75] Inventors: Joseph F. Akins; Donald G. Goddard; Cynthia P. Goszewski, all of Austin, Tex.; Ernest D. Haacke, Scarborough, Mass.

[73] Assignee: Advanced Micro Devices, Inc., Sunnyvale, Calif.

[21] Appl. No.: 254,751

[22] Filed: Oct. 7, 1988

[51] Int. Cl.⁵ .............................................. H03K 3/29
[52] U.S. Cl. .................................... 375/121; 307/475; 307/446; 364/927.93; 364/240.3
[58] Field of Search ................. 375/121; 307/475, 446, 307/465; 364/924.92, 927.77, 266.3, 239.9, 240.3

[56] References Cited

U.S. PATENT DOCUMENTS

| | | | |
|---|---|---|---|
| 4,430,582 | 2/1984 | Bose et al. | 307/475 X |
| 4,614,882 | 9/1986 | Parker et al. | 307/475 X |
| 4,645,954 | 2/1987 | Schuster | 307/475 |
| 4,719,372 | 1/1988 | Chappell et al. | 307/475 |
| 4,734,592 | 3/1988 | Essig et al. | 307/475 X |
| 4,797,582 | 1/1989 | Nguyen et al. | 307/475 |

FOREIGN PATENT DOCUMENTS

0203700 12/1986 European Pat. Off. ............. 307/475

Primary Examiner—Benedict V. Safourek
Assistant Examiner—Ralph Smith
Attorney, Agent, or Firm—Salzman & Levy

[57] ABSTRACT

A customizable communications bus control gate array for facilitating communications between devices on two disparate digital communications channels. The gate array has a mask programmable integrated circuit with two I/O interface devices which are respectively connected to two different communications channels. The gate array also has a translating device connected to each of the I/O interface devices for translating electrical signals therebetween. Logic control is also provided and connected to both of the I/O interface device and to the translating device for controlling operations thereof so that predetermined communications requirements between both of the disparate communications channels are satisfied.

22 Claims, 8 Drawing Sheets

MASK PROGRAMMABLE BUS CONTROL GATE ARRAY

BACKGROUND OF THE INVENTION

The present invention relates to a bus control gate array and, more particularly, to a mask programmable communications bus control gate array that can be customized for use between two disparate communications channels.

In the data processing field, communications buses and channels generally allow components and devices having similar or identical electrical characteristics to communicate with one another. But it is also often necessary to allow devices or components that have predetermined electrical properties to communicate with other devices having other predetermined electrical properties.

When larger computer systems include subsystems that communicate with one another, there has been a problem in allowing one bus to communicate with another bus having disparate electrical characteristics. For example, high performance, high speed systems comprising processors, for example, are often adapted to operate under the so-called emitter coupled logic (ECL) electrical standard; whereas lower performance, slower devices, such as certain peripheral equipment (e.g., printers, modems, mass storage devices and the like) tend to be adapted for transistor to transistor logic (TTL) electrical standards. Therefore, in order for a high performance, high speed processor operating under ECL standards to communicate with a lower performance, slower mass storage device operating under TTL standards, a mechanism to facilitate such communications between disparate communications channels had to be developed.

Heretofore, the apparatus used to allow devices on two disparate communications channels to communicate with one another has represented a unique, non-standardized approach for each application. The lack of standards obligated every computer manufacturer to solve this problem by devising a unique and individual solution. In many cases, these solutions required a number of individual components and connections between them, which connections often lead to a degradation of data integrity. Physical size of the components and the number thereof were appreciable. Thus, the cost of producing an interface was high, due to the number of components and amount of spaced required to house them. Power requirements were also elevated. Moreover, the amount of time required to translate data or information from one of the communications channels to a form compatible with another communications channel was also significant.

The components that were used to fabricate an interface were often off-the-shelf, standard components, preventing designers from constructing systems with the greatest flexibility. In other words, designers constrained to use off-the-shelf components could build in only the functions that could be used therewith.

It would be advantageous to provide a system for interfacing between two disparate channels.

It would also be advantageous to provide a system for interfacing for use with two disparate communications channels that would be cost effective.

It would also be advantageous to provide a system for interfacing that would be integrated on one integrated circuit chip.

It would also be advantageous to provide a system for providing an interface that could be customized according to the specific requirements of a user.

It would also be advantageous to provide a system for interfacing that would require relatively low power consumption.

It would also be advantageous to provide a system for interfacing between two communications channels that would require a minimal number of components.

It would also be advantageous to provide a system for interfacing whose operation would be time efficient.

It would also be advantageous to provide a system for interfacing between two communications channels that would require a minimum amount of physical space.

It would also be advantageous to provide a system for interfacing between two communications channels that would allow for data or information storage and/or manipulation, including error detection functions.

SUMMARY OF THE INVENTION

In accordance with the present invention, there is provided a customizable communications bus control gate array for facilitating communications between devices on two disparate digital communications channels. The gate array has a mask programmable integrated circuit with two I/O interface devices which are respectively connected to two different communications channels. The gate array also has a translating device connected to each of the I/O interface devices for translating electrical signals therebetween. Logic control is also provided and connected to both of the I/O interface devices and to the translating device for controlling operations thereof so that predetermined communications requirements between both of the disparate communications channels are satisfied.

BRIEF DESCRIPTION OF THE DRAWINGS

A complete understanding of the present invention may be obtained by reference to the accompanying drawings, when taken in conjunction with the detailed description thereof and in which: „

DESCRIPTION OF THE PREFERRED EMBODIMENT

Figure 1:
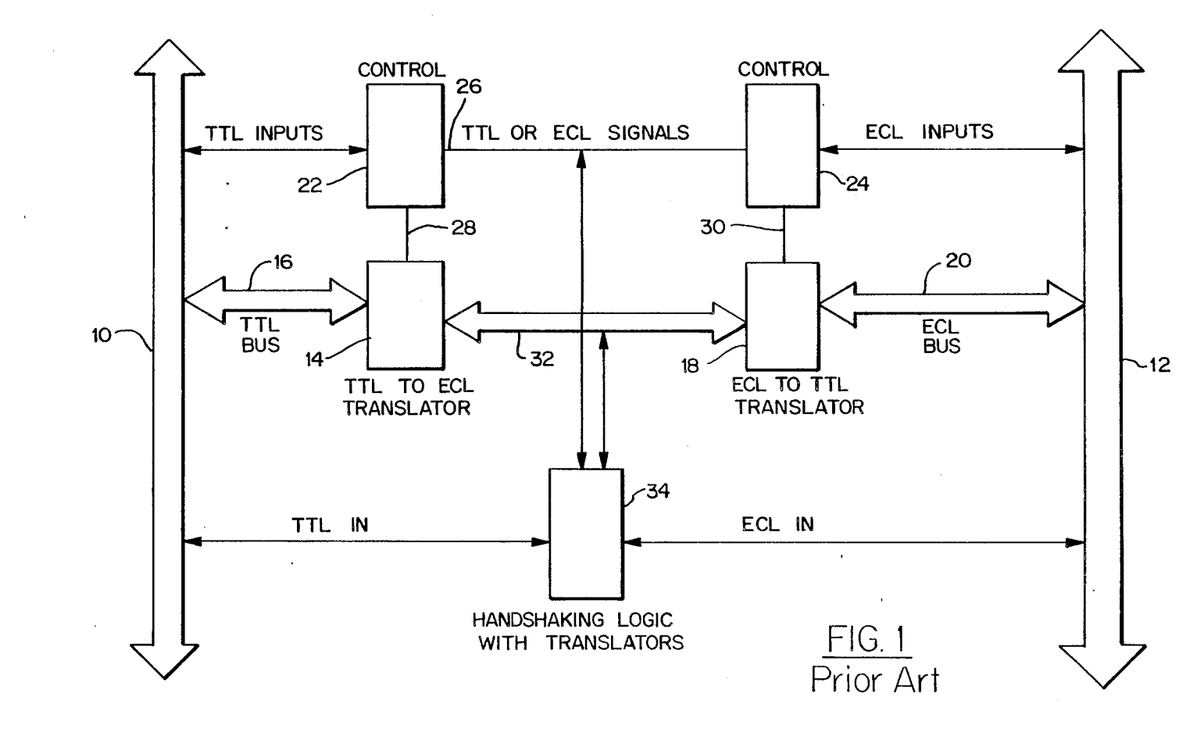
FIG. 1 is a block diagram showing a communications interface typical of the prior art.

Referring now to FIG. 1, there is shown a block diagram depicting a communications interface typical of the prior art. A communications channel or communications bus 10 is part of a TTL system, not shown, to which are connected equipment, components or devices such as printers, mass storage devices and the like, having relatively slow data transfer rates. Another communications channel 12 is adapted for communications among higher performance components, such as computer processors that operate under the ECL electrical characteristics format or standard. Connected to TTL communications bus 10 is a translator 14 for translating TTL signals to ECL signals. Translator 14 is generally connected to communications bus 10 directly, although it is shown for clarity in the FIGURE as an electrical connection 16. Similarly, an ECL to TTL translator 18 is connected directly to the ECL bus 12, but is shown in the FIGURE as electrically connected by means of lines 20.

Connected respectively to translators 14 and 18 are TTL control device 22 and ECL control device 24. Controllers 22 and 24 control the direction of the data path (i.e., from TTL side to ECL side or from ECL side to TTL side). Controllers 22 and 24 are connected to one another over lines 26 and are also connected directly and respectively to translators 14 and 18 over lines 28 and 30. Translators 14 and 18 are connected to one another internally in the chip by means of an electrical connection 32.

Also connected to signal line 32 between translators 14 and 18 is a device 34 having logic for allowing storage and/or manipulation of data. Often data is transferred at a faster rate over the ECL communications channel 12 than it is over the TTL communications channel 10. For this purpose, logic device 34 is also connected to lines 26 between controllers 22 and 24 for the purpose of synchronizing disparate data flow rates therebetween.

At least five components and a plurality of signal lines were required in the prior art to perform an interfacing function between communications buses 10 and 12. Data generated or transmitted by a device, not shown, connected to TTL communications bus 10 would be translated, stored or manipulated by the foregoing apparatus before being applied to a device, not shown, connected to ECL communications channel 12.

Figure 2:
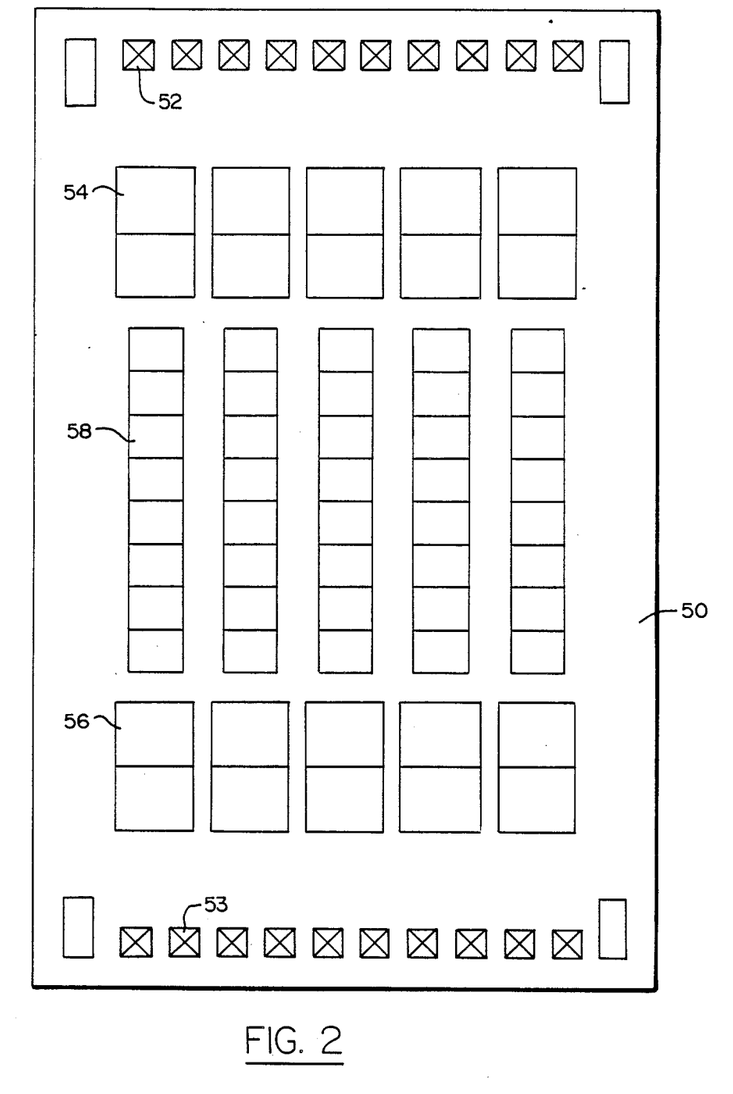
FIG. 2 is an exploded view of a physical layout of the blank base array of the present invention.

Referring now also to FIG. 2, there is shown an integrated circuit (IC) chip 50 in accordance with the present invention on which is located a plurality of bond pads 52 and 53. Bond pads 52 can be connected to one of the communications buses, not shown in this FIGURE. Similarly, bond pads 53 can be connected to a second communications bus. Thus, data from the first communications bus is ported into the IC 50 by means of bond pads 52 and eventually is ported out to the second communications bus by means of bond pads 53. Similarly, information initiated from the second communications bus can be ported into the IC 50 by means of bond pads 53 and applied to the first communications bus by means of bond pads 52.

The gate array of the present invention, described in greater detail below, integrates up to 410 ECL-equivalent gates to eliminate so-called "glue" logic. This results in reduced board space and improved reliability. The array is especially useful in systems that require ECL speeds with TTL compatability.

A plurality of input/output (I/O) cells is identified by reference numeral 54. In the preferred embodiment, ten I/O cells form an interface between the first communications bus and a plurality of internal logic cells, hereinafter described. Similarly, another ten I/O cells 56 are disposed adjacent bond pads 53 for cooperation with the second communications bus.

Disposed between the two banks of I/O cells 54 and 56 is a plurality of internal logic cells 58 arranged, in the preferred embodiment, in five banks of eight cells apiece, providing a total of 40 internal logic cells. This arrangement allows for the design of hard macros (multicell macros having fixed, predefined interconnect patterns) that are as large as eight cells long, filling an entire column. The I/O cells 54 and 56 are described in greater detail below, as are internal logic cells 58.

Depicted in FIG. 2 is the IC 50 configured in a so-called blank or uncustomized bus control gate array. This blank gate array can be customized according to specific requirements of a user by electrically connecting the bond pads 52 and 53 or any combination thereof to any one or more I/O cells 54 and 56 or any one or more internal logic cells 58, an example of which is described hereinbelow.

Each internal logic cell 58 contains a fixed array of 19 transistors and 32 resistors that can be interconnected with a metal pattern to perform a wide variety of logic functions. These functions are known as macrocells. Functions as complex as a D flip flop can be implemented in one logic cell.

A user having specific, predetermined requirements for transferring data from one communications bus to another communications bus or vice versa can configure his or her gate array IC 50 appropriately for that purpose. Parameters to be considered when configuring a gate array IC 50 include, but are not limited to:

speed requirements;

control requirements which relate to the format in which data is presented on the respective communications buses;

functionality requirements, such as the ability to store and/or manipulate data or information from one communications bus to another; and protocol requirements that allow a faster communications bus to communicate with a slower communications bus by means of buffer devices (e.g., storage registers) to compensate for the differences in data transfer schemes.

In this way, any configuration is possible within the limits of the number of bond pads 52 and 53, I/O cells 54 and 56 and internal logic cells 58 within one IC chip 50.

Typical speed of the ECL gates is 280 ps, operating with typical power of 1.5 to 4.5 mW/gate. Power consumption depends on a number of factors: population of the array, specific macros used and programmable power/speed choices. A maximum of 1.5 Watts is available. Current switches are fixed and the Output Emitter Followers (OEFs) are programmable to low or medium options. Medium OEFs have greater speed than do low OEF's.

The gate array of the present invention can operate in four different modes of external logic levels: TTL, Pseudo ECL (PECL), True ECL (TECL), TTL & TECL, TTL & PECL. In TTL mode, ECL internal speeds are achieved while TTL I/O levels are supplied for interface with TTL systems. In PECL mode, a positive (+5 V) supply is used. TECL mode provides compatibility with pure ECL systems. The TTL & TECL mode provides level translation capabilities for both TTL and True ECL, useful in mixed technology systems.

| Mode | Power Supplies | I/O Levels |
|---|---|---|
| TTL | +5 V | LS |
| PECL | +5 V | 10K Ref. to +5 V |

| Mode | Power Supplies | I/O Levels |
| --- | --- | --- |
| TECL | −5.2 or −4.5 V | 100K Ref. to +5 V<br>10K or 100K |
| TTL & TECL | +5 & −5.2 V<br>or +5 & −4.5 V | LS/TECL (10K)<br>LS/TECL (100K) |
| TTL & PECL | +5 V | LS/PECL (10K)<br>LS/PECL (100K) |

In TTL mode, ECL internal circuits provide high performance in TTL-compatible systems. PECL mode reduces level translator delays between closely coupled blocks in a TTL environment. TTL & TECL mode provides level translation capabilities between TTL and True ECL functions. PECL & TTL provide translation between TTL and Psuedo ECL functions.

Figure 3:
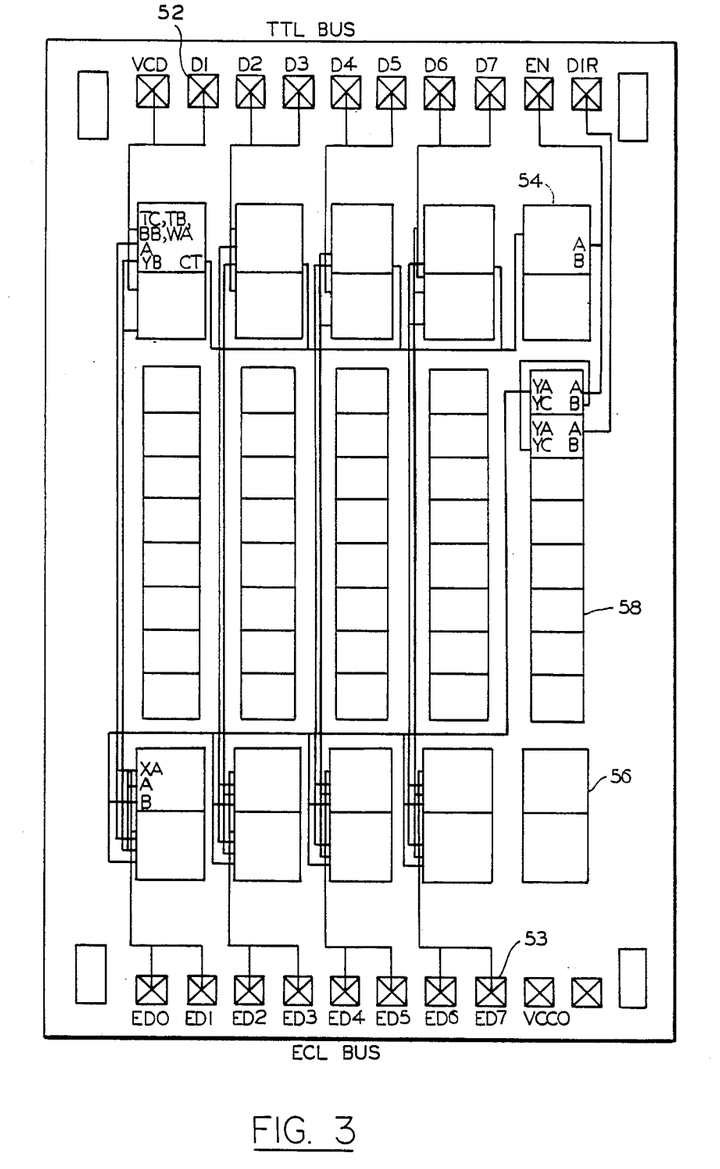
FIG. 3 is an exploded view of a physical layout of a customized array.

Referring now also to FIG. 3, there is shown an exploded view of a physical layout of a previously blank or uncustomized IC 50 that has been customized for a particular function. The customization of IC 50 is facilitated by individually programming the array mask by any suitable technique well known in the art. A plurality of lines connect individual internal logic cells 58 to one another, to selected I/O cells 54 and 56 and to selected bond pads 52 and 53. Similarly, selected I/O cells 54 can be connected individually to one another as well as to selected bond pads 52 and 53 and, of course, to selected internal logic cells 58 and banks thereof. Although not shown in this FIGURE, bond pads 52 and 53 can also be connected to one another.

The configuration disclosed in FIG. 3 represents a TTL/ECL bidirectional bus transceiver. ECL data is connected to bond pads ED0–ED7 at reference numeral 90. TTL data is connected to bond pads D0–D7 at reference numeral 92. The interconnection between the two aforementioned buses is by internal signal lines 94. Simple handshaking and control is facilitated by direction and enable pins 96.

Internal logic to arbitrate data transfer is facilitated within the two internal cells and one I/O cell 98. The ECL output drivers are disposed in I/O cells 100. The TTL I/O translators are in I/O cells 102. An additional power pad for VCCO is shown at reference numeral 104.

For clarity, a bias generation network is not shown in the FIGURES, although as a practical matter such bias generation network is normally required for a gate array with ECL capability. The bias generation network is used to provide reference levels for internal and external signals. The use of bias generation networks is well known in the art and need not be explained further here.

Figure 4:
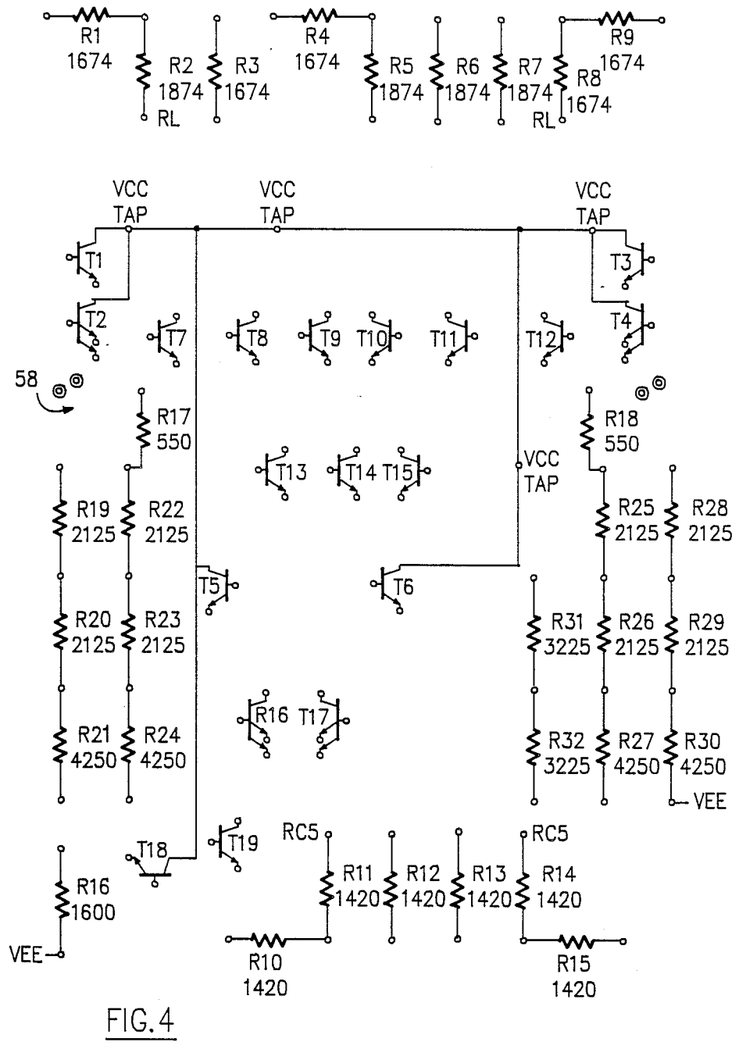
FIG. 4 is a schematic diagram of a blank internal logic cell.

Referring now also to FIG. 4, there is shown a schematic diagram of a so-called blank internal logic cell 58 (FIG. 2), in which no connections between components exist other than the hard wired device boundary connections. Thus, nineteen transistors T1–T19 are shown generally disconnected, but can be connected to one another according to certain predetermined rules. Similarly, resistors R1–R30 are shown connected to common contacts. They can be connected en banc, however, to one another and to other components on the IC board 58.

Each internal logic cell 58 can be customized (i.e., the components thereon can be connected to one another) according to certain predetermined desired functions and requirements. For example, if a particular internal logic cell 58 were to be configured as a D-latch with Reset circuit, the transistors and resistors are connected to one another in a predetermined, specified manner. Similarly, if an internal logic cell 58 were to function as a 2-to-1 inverting multiplexer, flip flop, gate or the like, the same transistors and resistors or other transistors and resistors would be connected to one another in a different manner in accordance with functions that such internal logic cell 58 were to perform.

Each logic cell contains a 2-to-1 power selection system for the Output Emitter Follower (OEF). The OEF controls output metal delays. This allows a tradeoff between speed and power in critical paths at both the chip and system levels.

Power supplies are connected to the internal logic cell 58 and are shown in this FIGURE as TTLVCC and TTLGND. Other power supplies, however, can be connected to the internal logic cell 58. A description of the power supplies is provided hereinbelow.

The present invention can be used in several power modes to meet various applications. In the preferred embodiment, a 24-pin dual in-line package is suitable for the following power modes.

ECLVCC is a positive power supply for the internal ECL circuitry. In TECL and ECL ONLY modes, it is 0 volts. In both PECL modes it is +5 volts.

TTLVCC is a positive power supply for TTL compatible outputs. It is +5 volts in all modes with TTL outputs.

VEE is a negative supply for the internal ECL circuitry. In both PECL modes it is 0 volts. In TECL and ECL ONLY modes it is −5.2 volts for 10K and −4.5 volts for 100K.

VCCO is a supply that provides switching drive for ECL outputs In TECL and ECL ONLY modes it is 0 volts and is physically connected internally to TTLGND. In both PECL modes it is +5 volts and is physically separate from TTLGND.

TTLGND is a negative power supply that provides switching drive for TTL outputs. It is 0 volts in all modes that have TTL outputs. In TECL and ECL ONLY modes it is physically connected to VCCO. In both PECL modes it is physically separate from VCCO.

Figure 5:
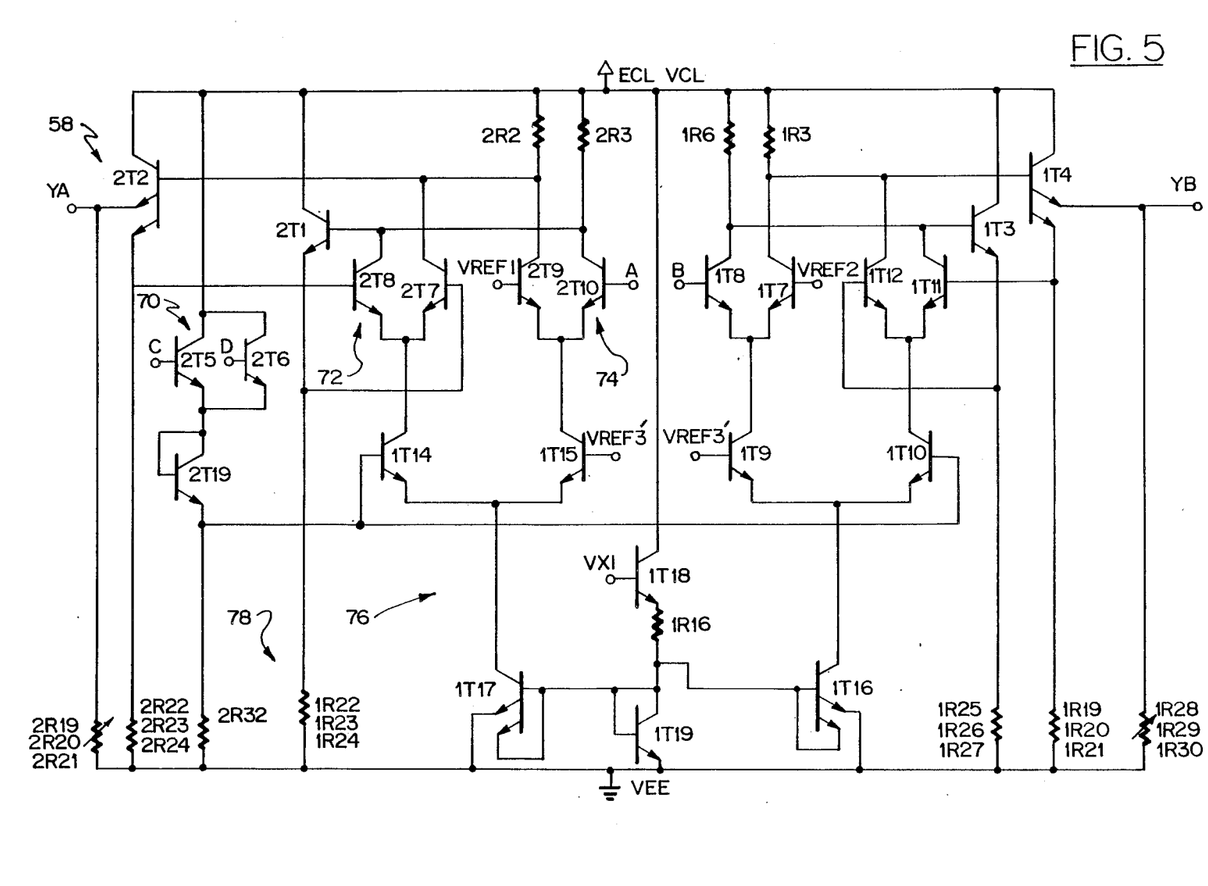
FIG. 5 is a schematic diagram of a customized internal logic cell.

Referring now also to FIG. 5, there is shown a dual latch circuit configured from a blank input logic cell 58 (FIG. 4). A pair of transistors 2T5 and 2T6, shown generally at reference numeral 70, enable both latches in the circuit. Other dual transistor configurations 2T7 and 2T8 form a basic logic gate 72. Similarly, transistors 2T9 and 2T10 form another logic gate 74, the data input of which is shown as letter A. Corresponding to data input A is data input B for the second latch.

A current mirror 76 comprises transistors 1T16–1T19. Current mirror 76 determines the amount of current used by the gates. Also shown in FIG. 5 is a plurality of resistors (for example, 1R22–1R24, shown generally at reference numeral 78). The outputs of the latches are shown as reference letters YA and YB, respectively, in this FIGURE.

The latch shown in FIG. 5 is a typical latch known to those with ordinary skill in ECL technology and the gates are adapted for ECL operation. This internal logic cell 58 in ECL format can be found anywhere within the bank of internal logic cells 58 in the integrated circuit 50, due to the fact that TTL to ECL translators in I/O cells 54 and 56 (FIG. 2) are used to convert TTL signals to ECL format. Thus, all signals on the IC 50 downstream of the translators, not shown, are adapted for use with ECL.

Figures 6, 6A:
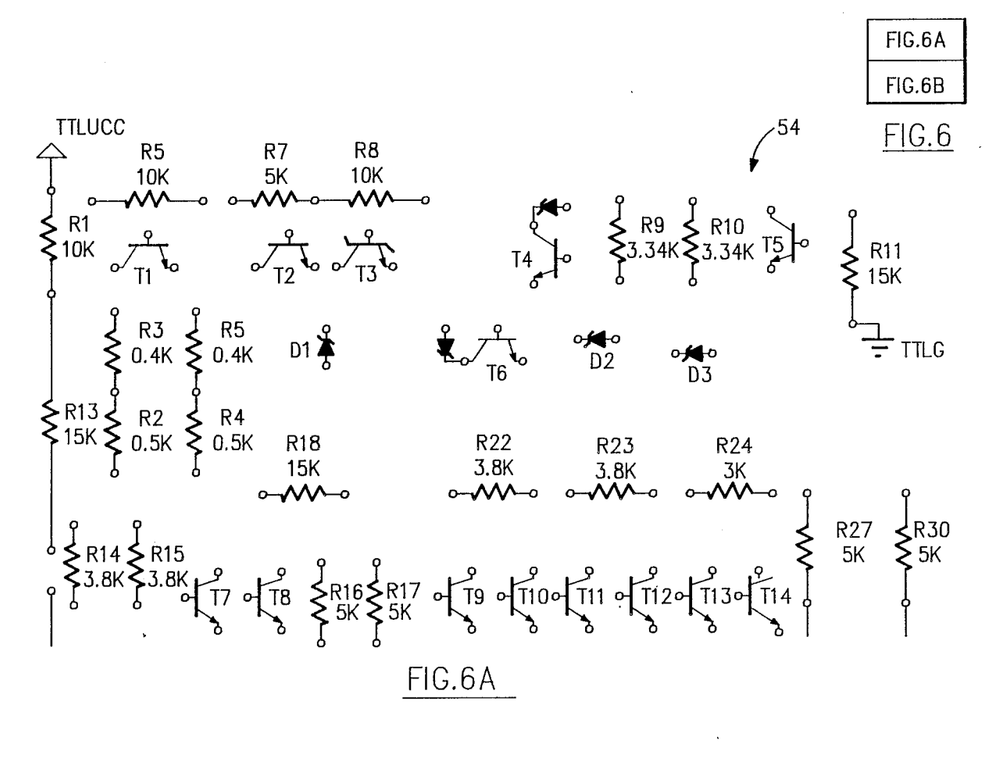
FIGS. 6A and B are schematic diagrams of a blank I/O cell.
Figure 6B:
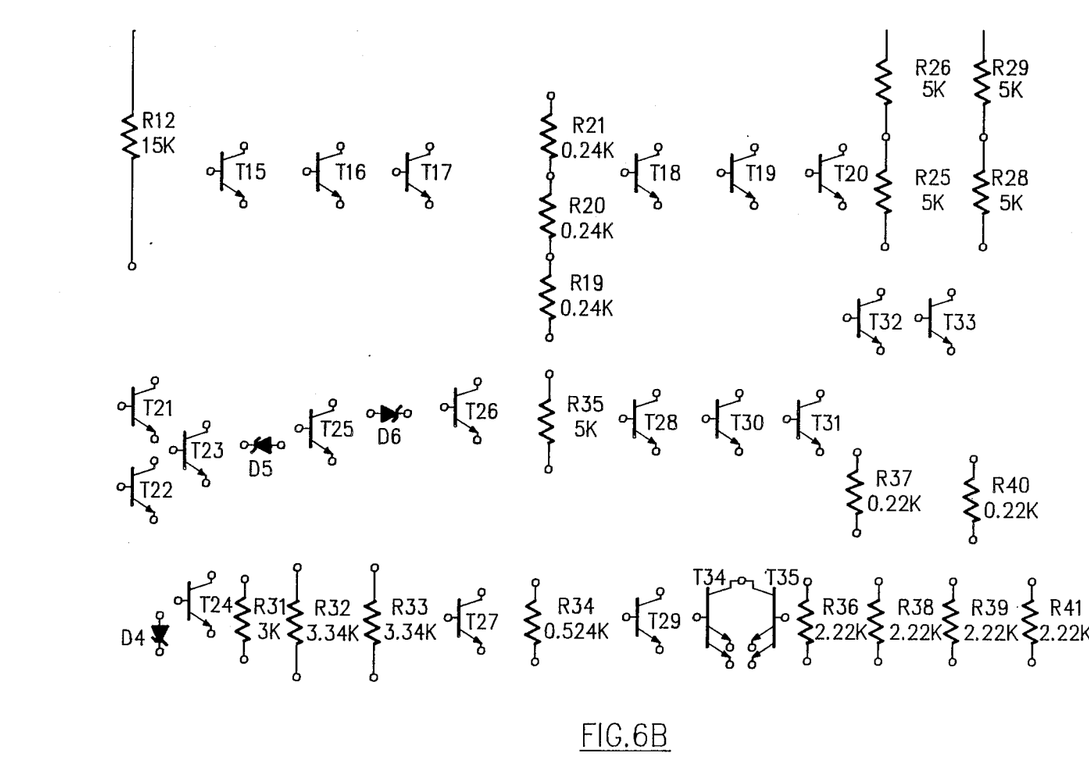

Referring now also to FIG. 6, there is shown a schematic diagram of a blank I/O cell 54 (FIG. 2), twenty of which reside on the array, and any of which can be used as input, output or bidirectional; true and complement outputs are available on-chip which eliminate inverter delays and reduce power and cell usage; 25 to 50 ohm ECL outputs are also available. The I/O cell 54 has transistors T1–T35 and resistors R1–R41.

Also part of the I/O cell 54 or 56 are diodes D1–D6. These components provide the capability of level shifting from internal ECL logic levels to various external signal levels. Any of the twenty I/O locations can be designated as input, output or bidirectional; TTL, TECL or PECL. Generally, ECL inputs are applied directly into the interface cells. However, I/O cells may be used as ECL inputs when necessary. There are no restrictions associating or confining specific I/O macrocells to specific I/O locations.

As with logic cells, power supplies are connected to the I/O cells 54 and 56 and are shown in this FIGURE as TTLVCC and TTLGND. Once again, other power supplies can be connected to the I/O cells 54. A description of the power supplies, similar to the description provided above with regard to the internal logic cells (FIG. 4), is provided hereinbelow.

ECLVCC is a positive power supply for the internal ECL circuitry. In TECL and ECL ONLY modes, it is 0 volts. In both PECL modes it is +5 volts.

TTLVCC is a positive power supply for TTL compatible outputs. It is +5 volts in all modes with TTL output.

VEE is a negative supply for the internal ECL circuitry. In both PECL modes it is 0 volts. In TECL and ECL ONLY modes it is −5.2 volts for 10K and −4.5 volts for 100K.

VCCO is a supply that provides switching drive for ECL outputs. In TECL and ECL ONLY modes it is 0 volts and is physically connected internally to TTLGND. In both PECL modes it is +5 volts and is physically separate from TTLGND.

TTLGND is a negative power supply that provides switching drive for TTL outputs. It is 0 volts in all modes that have TTL outputs. In TECL and ECL ONLY modes it is physically connected to VCCO. In both PECL modes it is physically separate from VCCO.

The I/O cells 54 and 56 can be customized by a user in order to fulfill specific requirements and functions. Sample functions that an I/O cell 54 and 56 can perform are: TTL to ECL translation; ECL to TTL translation; ECL input with ECL output; and TTL input with TTL output. I/O cells 54 and 56 can be programmed for I/O bus translation regardless of the bus protocol of either of the communications buses connected thereto.

Figure 7:
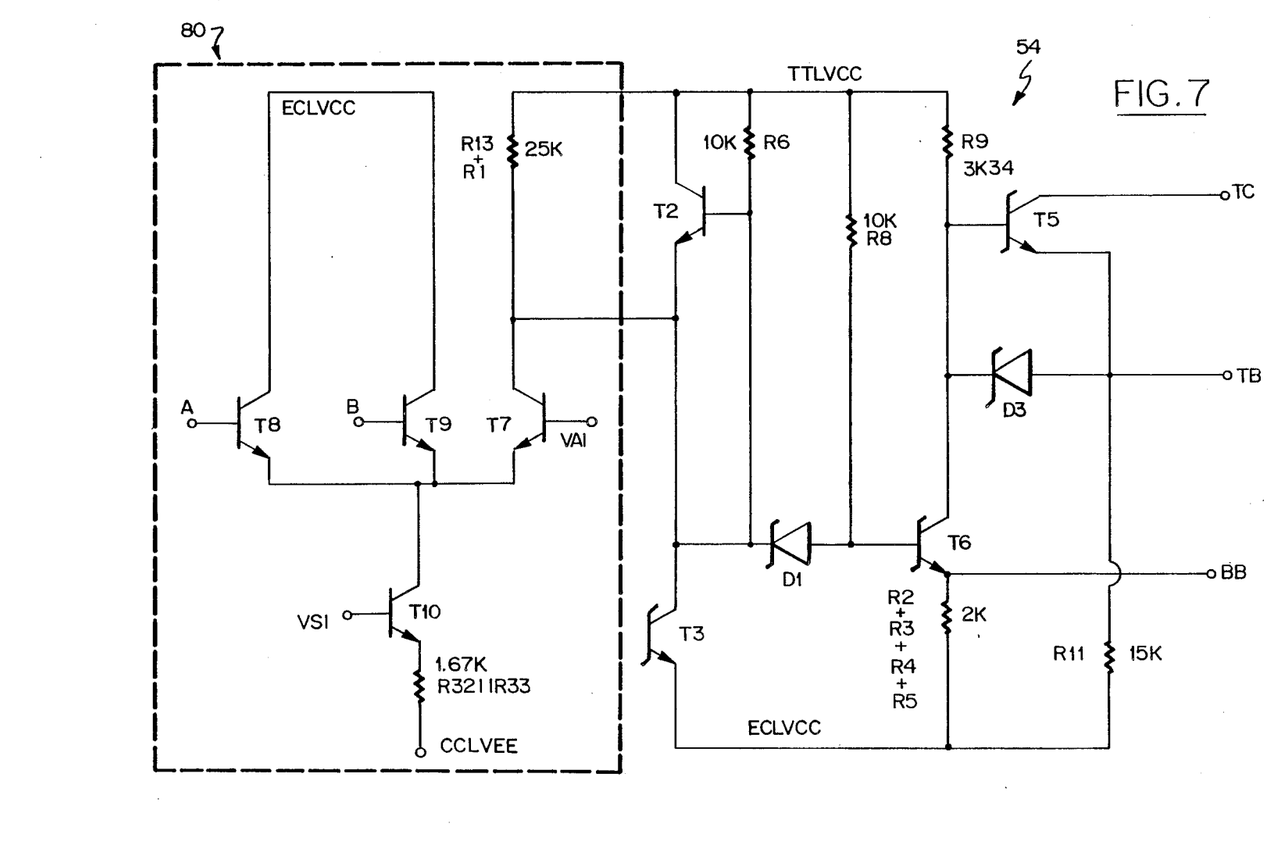
FIG. 7 is a schematic diagram of a customized I/O cell.

Referring now also to FIG. 7, there is shown a schematic diagram of a customized I/O cell 54 or 56 (FIG. 2), which is used to translate ECL formatted signals from an ECL communications channel, not shown, to TTL formatted signals for use with a TTL communications channel, not shown. Output transistors, not shown, are located adjacent the bond pads 52 (FIG. 2). The ECL portion of I/O cell 54 is shown in phantom and identified as reference numeral 80. The remainder of I/O cell 54 shown in FIG. 7 represents the TTL portion of the circuit.

Although this particular I/O cell 54 translates TECL formatted data to TTL formatted data, it may be necessary to provide other I/O cells 54 for translating PECL formatted data to TTL formatted data, complementary cells for translating in the reverse direction, and other cells for handling different parameters such as three-state versus open collector devices, 8 milliamp versus 16 milliamp devices and the like. Thus, a separate I/O cell 54 is required for each translation possibility which, in turn, is dependent upon the aforementioned parameters. In the preferred embodiment, the drive requirement for external signals requires I/O cells to provide additional current drive for signals that are destined for off-chip destinations. In other words, I/O cells 54 and 58 may be required to convert internal ECL signals to external ECL signals, the latter usually having greater power requirements.

It can thus be seen that the present invention, residing on one IC chip 50 (FIG. 2), is a direct replacement for the plurality of components commonly used in the prior art (FIG. 1) and that such a replacement and substitution represents improved characteristics and a significant advance in the art in terms of power consumption, speed, geographical displacement, reduced parts inventory and cost.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

What is claimed is:

1. A customizable communications bus control gate array for facilitating communications between device on two disparate digital communications channels comprising a mask programmable integrated circuit having a first I/O interface means for connection to said first communications channel, a second I/O interface means for connection to said second communications channel, translating means operatively connected to each of said I/O interface means for translating the electrical signals therebetween, and logic control means including electrical I/O control means and information control means, said logic control means being operatively connected to both of said I/O interface means and to said translating means for respectively regulating electrical performance of each I/O interface means, and the direction and timing of information flow between said communications channels.

2. The gate array in accordance with claim 1 wherein one of said communications channels is adapted to use a TTL electrical characteristics standard.

3. The gate array in accordance with claim 1 wherein one of said communications channels is adapted to use an ECL electrical characteristics standard.

4. The gate array in accordance with claim 3 wherein said ECL electrical characteristics standard is 10KH compatible.

5. The gate array in accordance with claim 3 wherein said ECL electrical characteristics standard is 100KH compatible.

6. The gate array in accordance with claim 2 wherein the other of said communications channels is adapted to use an ECL electrical characteristics standard.

7. The gate array in accordance with claim 6 wherein said ECL electrical characteristics standard is 10KH compatible.

8. The gate array in accordance with claim 3 wherein said ECL electrical characteristics standard is 100KH compatible.

9. The gate array in accordance with claim 1, wherein said logic control means further comprises storage means for temporarily storing information provided by one of said communications channels.

10. The gate array in accordance with claim 9 wherein said information control means is further adapted to regulate operation of said storage means.

11. The gate array in accordance with claim 1, wherein said information control means further comprises data manipulation means for handling information from one of said communications channels.

12. The gate array in accordance with claim 11 wherein said data manipulation means comprises means for performing error detection.

13. The gate array in accordance with claim 12 wherein said means for performing error detection comprises means for performing parity checking.

14. An interface for allowing a device connected to one communications bus and adapted to operate in accordance with first electrical characteristics based on ECL logic protocol to communicate with another device connected to another communications bus and adapted to operate in accordance with second electrical characteristics based on TTL logic protocol, comprising:
   (a) first I/O mask programmable interface means operatively connected to a first bus;
   (b) second I/O mask programmable interface means operatively connected to a second bus; and
   (c) logic control means comprising translating means for translating electrical signals from ECL to TTL logic and from TTL to ECL logic, and electrical I/O control means operatively connected to said first and to said second I/O interface means for facilitating and regulating information flow therebetween, said logic control means being mask programmable to facilitate customizing said interface in accordance with predetermined criteria which are functions of said first and said second electrical characteristics.

15. The interface in accordance with claim 14, wherein said information control means is also adapted to synchronize said information flow between said communications buses.

16. The interface in accordance with claim 15 further comprising:
   (d) storage means for storing information provided by one of said communications buses.

17. The interface in accordance with claim 16 wherein said storage means comprises a data storage register.

18. The interface in accordance with claim 16 wherein said logic control means is further adapted to control operation of said storage means.

19. The interface in accordance with claim 18 further comprising:
   (e) information handling means for manipulating data.

20. The interface in accordance with claim 19 wherein said information handling means is adapted to perform arithmetic operations on data.

21. The interface in accordance with claim 20 wherein said information handling means is adapted to perform error detecting operations.

22. The interface in accordance with claim 21 wherein said error detecting operations comprise parity checking.

* * * * *